(12) United States Patent
Costello et al.

(10) Patent No.: US 7,696,717 B2
(45) Date of Patent: Apr. 13, 2010

(54) BATTERY ENERGY MANAGEMENT SYSTEM FOR MEASURING A MINIMUM BATTERY VOLTAGE

(75) Inventors: John R. Costello, Rochester Hills, MI (US); Scott J. Lucy, Lake Orion, MI (US); Thomas S. Schaffer, Shelby Township, MI (US)

(73) Assignee: Continental Automotive Systems US, Inc., Auburn Hills ( * ) Notice: Subject to any disclaimer, the term of this patent is extended or adjusted under 35 U.S.C. 154(b) by 440 days.

(21) Appl. No.: 11/500,640

(22) Filed: Aug. 8, 2006

(65) Prior Publication Data
US 2007/0029968 A1 Feb. 8, 2007

Related U.S. Application Data

(60) Provisional application No. 60/706,391, filed on Aug. 8, 2005.

(51) Int. Cl.
*H02J 7/14* (2006.01)
(52) U.S. Cl. .................... 320/104; 320/133; 320/134
(58) Field of Classification Search ................ 320/104, 320/133, 134, 152
See application file for complete search history.

(56) References Cited

U.S. PATENT DOCUMENTS

| 4,480,902 | A | * | 11/1984 | Kawamura ................. 396/233 |
|---|---|---|---|---|
| 4,547,629 | A | * | 10/1985 | Corless ....................... 379/412 |
| 4,731,601 | A | * | 3/1988 | Nowakowski et al. ....... 340/439 |
| 4,737,702 | A | * | 4/1988 | Koenck ...................... 320/114 |
| 5,101,160 | A | * | 3/1992 | Barjonnet et al. ........... 324/510 |
| 5,231,273 | A | * | 7/1993 | Caswell et al. .............. 235/385 |
| 5,385,126 | A | * | 1/1995 | Matthews .............. 123/179.21 |
| 5,509,576 | A | * | 4/1996 | Weinheimer et al. ........... 222/5 |
| 5,627,759 | A | * | 5/1997 | Bearden et al. ............... 702/62 |
| 5,937,622 | A | * | 8/1999 | Carrier et al. ................ 56/11.9 |
| 6,157,661 | A | * | 12/2000 | Walker et al. ............ 372/38.02 |
| 6,425,087 | B1 | * | 7/2002 | Osborn et al. ............... 713/340 |
| 7,184,861 | B2 | * | 2/2007 | Petite ......................... 700/295 |
| 2003/0173126 | A1 | * | 9/2003 | Gosselin .................... 180/65.3 |
| 2004/0015428 | A2 | * | 1/2004 | Johnson et al. ............... 705/37 |
| 2004/0108834 | A1 | * | 6/2004 | Takano et al. ............... 320/120 |
| 2005/0151658 | A1 | * | 7/2005 | Kono et al. ................. 340/647 |
| 2007/0024241 | A1 | * | 2/2007 | Bean et al. .................. 320/132 |
| 2007/0084444 | A1 | * | 4/2007 | Bellistri et al. .............. 123/497 |

\* cited by examiner

*Primary Examiner*—Edward Tso
*Assistant Examiner*—Arun Williams

(57) ABSTRACT

A method of monitoring a battery energy management system includes discharging a detector circuit to a minimum battery voltage, measuring an elapsed time that the minimum battery voltage is detected, resetting a timer circuit, and sampling the minimum battery voltage and the elapsed time of the minimum battery voltage in response to a predefined prompt. The discharge of the detector circuit, the measurement of the minimum battery voltage, the elapsed time of the minimum battery voltage, and the reset of the timer circuit are performed in response to an input voltage being less than the voltage stored within the detector circuit.

18 Claims, 5 Drawing Sheets

BATTERY ENERGY MANAGEMENT SYSTEM FOR MEASURING A MINIMUM BATTERY VOLTAGE

CROSS-REFERENCE TO RELATED APPLICATIONS

This application claims priority to U.S. Provisional Application No. 60/706,391, filed Aug. 8, 2005.

BACKGROUND OF THE INVENTION

This invention generally relates to diagnostic systems, and more particularly to a battery energy management system for measuring a minimum battery voltage and an elapsed time of the minimum battery voltage.

Electrical systems, such as automotive electrical systems, are becoming increasingly complex. Known electrical systems typically include a microcontroller which controls the operation of a variety of electrical systems found thereon, including but not limited to remote keyless entry systems, passive entry and starting systems, tire pressure monitoring systems and vehicle diagnostic systems. Other known devices, such as cell phones and medical devices, also utilize a microcontroller which controls the electrical systems within these devices. The microcontrollers of many of these systems may be overloaded because of the numerous electrical systems for which the microcontroller must control and operate.

One function of vehicle diagnostic systems includes detecting and measuring a minimum battery voltage of a vehicle battery when starting a vehicle (i.e., during engine cranking). The minimum battery voltage of a vehicle battery is measured to ensure that the energy level of the battery is sufficient to supply an adequate amount of power to the numerous electrical systems of the vehicle such that these systems operate properly. The vehicle diagnostic system measures the minimum battery voltage and alerts the vehicle operator by communicating a battery error signal to the operator where the detected minimum battery voltage is below a certain level, for example.

One known vehicle diagnostic system includes a battery energy management system which is entirely implemented with the internal peripherals of the microcontroller. The microcontroller utilizes an analog to digital (A/D) converter and internal timer peripherals to measure the minimum battery voltage. Disadvantageously, the microcontroller loading requirements are increased by the necessity to detect and measure the minimum battery voltage. The increase in microcontroller load, when combined with the resources already expended by the microcontroller to control the various other electrical systems of the vehicle, may result in less accurate minimum battery voltage measurements and delayed functionality of the remaining electrical systems of the vehicle. Similar problems may be experienced by the microcontrollers of other devices (i.e. cell phones, medical devices, etc.).

Accordingly, it is desirable to provide a battery energy management system that detects and measures a minimum battery voltage and an elapsed time of the minimum battery voltage while simultaneously reducing the load requirements of a system microcontroller.

SUMMARY OF THE INVENTION

An example method of monitoring a battery energy management system includes discharging a detector circuit to a minimum battery voltage, measuring an elapsed time that the minimum battery voltage is detected, resetting a timer circuit, and sampling the minimum battery voltage and the elapsed time of the minimum battery voltage in response to a predefined prompt. In one example, the discharge of the detector circuit, the measurement of the minimum battery voltage and the elapsed time of the minimum battery voltage and the reset of the timer circuit are performed in response to an input voltage being less than the voltage stored within the detector circuit. In another example, the predefined prompt includes a reduction in the load requirements of a microcontroller.

The example method further includes charging the detector circuit with a supply voltage and communicating a clock signal to the timer circuit. In one example, the charging of the detector circuit and the communication of the clock signal to the timer circuit are performed prior to sampling the minimum battery voltage and the elapsed time of the minimum battery voltage.

An example battery energy management system includes a microcontroller and a battery energy management circuit mounted exterior to the microcontroller. An example battery energy management circuit includes a detector circuit, a timer circuit and a timer reset circuit. The battery energy management circuit is operable to detect and measure a minimum battery voltage in response to an input voltage being less than the voltage stored within the detector circuit.

BRIEF DESCRIPTION OF THE DRAWINGS

The various features and advantages of this invention will become apparent to those skilled in the art from the following detailed description of the currently preferred embodiment. The drawings that accompany the detailed description can be briefly described as follows.

DETAILED DESCRIPTION OF THE PREFERRED EMBODIMENT

Figure 1:
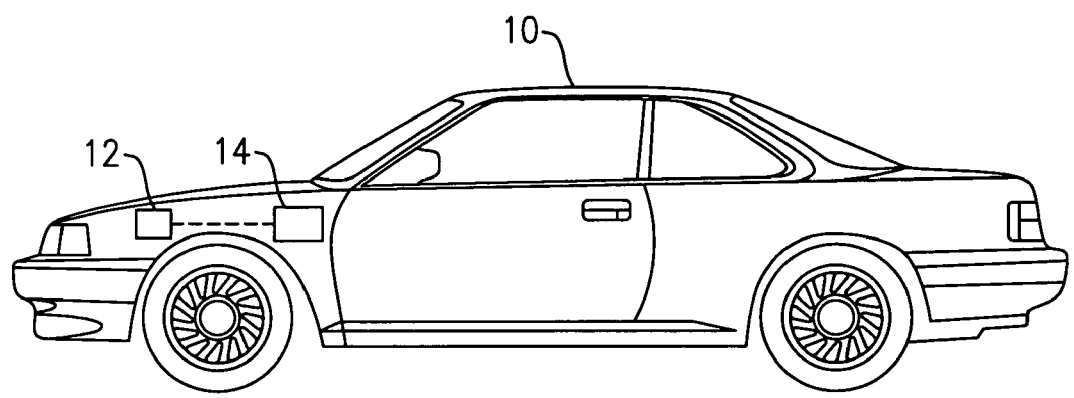
FIG. 1 is a schematic representation of a vehicle equipped with a computer module having vehicle diagnostic capabilities.

Referring to FIG. 1, a vehicle 10 includes a vehicle battery 12 and at least one computer module 14. The vehicle battery 12 communicates with the computer module 14 in a known manner to provide the computer module 14 with the appropriate level of electrical power to control the electrical systems of the vehicle. Although described in terms of a vehicle electronic system, it should be understood that the example features and advantages disclosed herein may be utilized with other devices including but not limited to cell phone systems, medical devices, automatic faucet systems, security systems and central heating and cooling systems.

Figure 2:
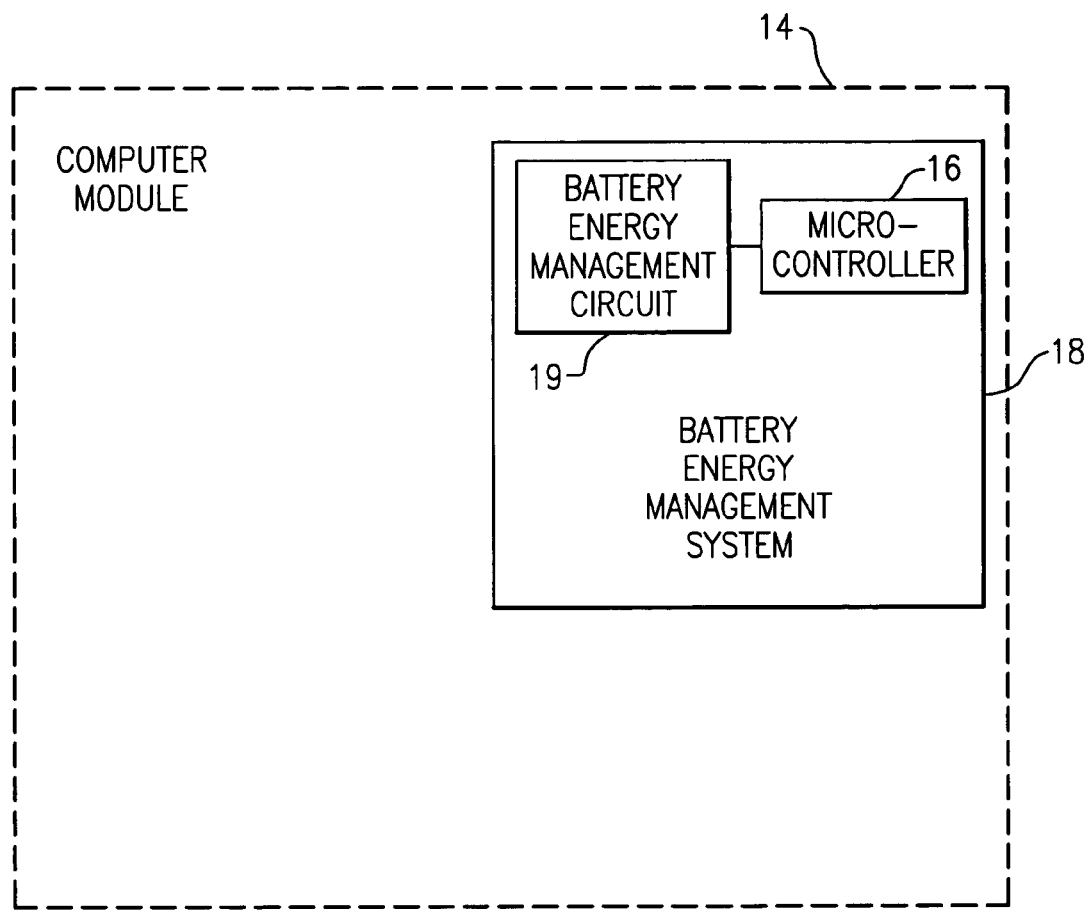
FIG. 2 illustrates an example computer module having a microcontroller and a battery energy management system according to the present invention.

Referring to FIG. 2, the computer module 14 of vehicle 10 includes at least one vehicle diagnostic system, such as a battery energy management system 18. It should be understood that other vehicle diagnostic systems may be provided by the computer module 14. In one example, the battery energy management system 18 includes a microcontroller 16 and a battery energy management circuit 19 which is mounted at least partially exterior to the microcontroller 16. The battery energy management system 18 is capable of measuring a minimum battery voltage and an elapsed time of the minimum battery voltage, as is further discussed below.

Figure 3:
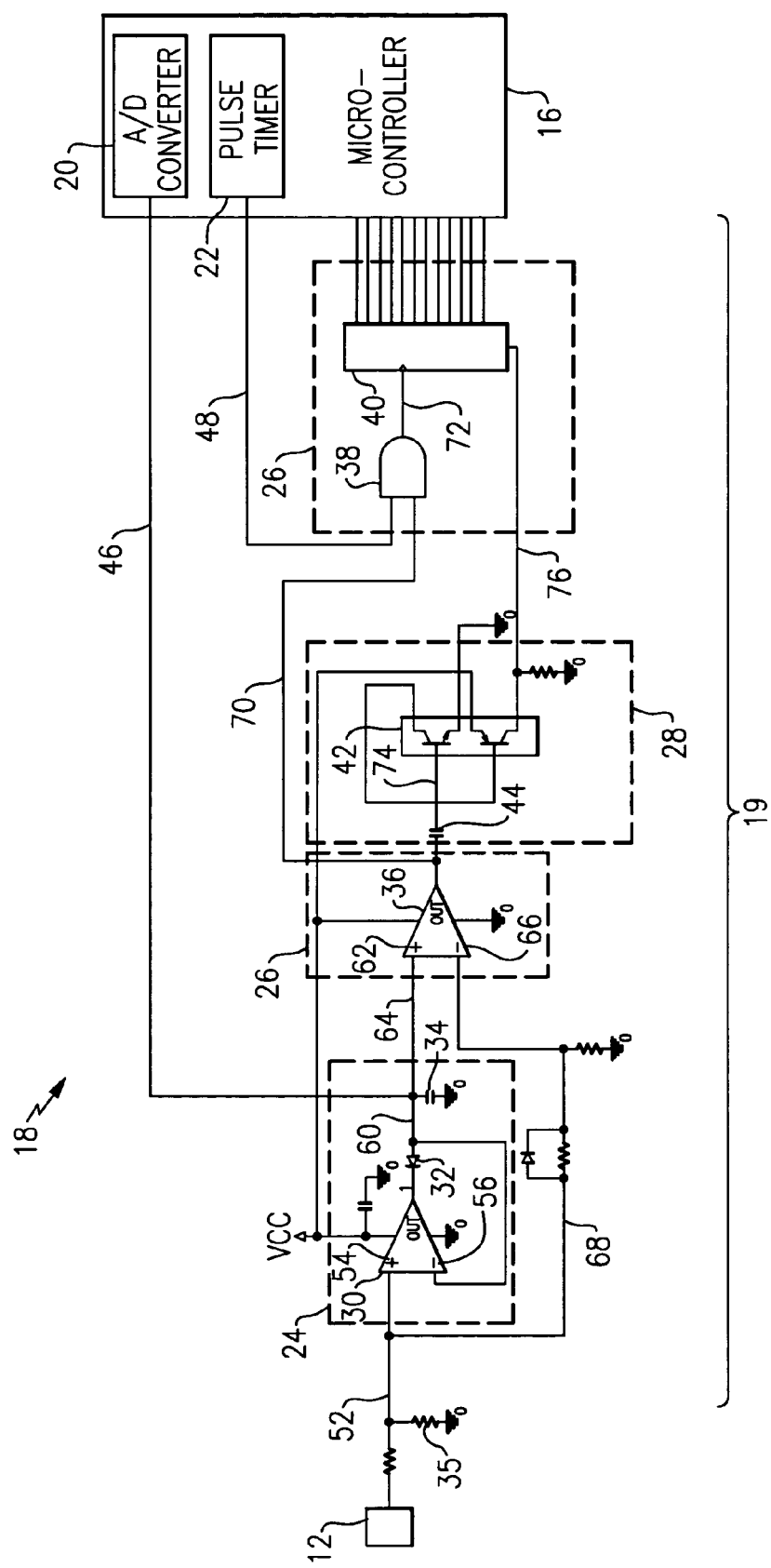
FIG. 3 illustrates an example battery energy management system according to the present invention.

Referring to FIG. 3, an example battery energy management system 18 for performing the minimum battery voltage measurement and the elapsed time of the minimum battery voltage measurement is illustrated. In one example, the minimum battery voltage (Vmin) represents the minimum voltage level produced by the vehicle battery 12 during a cranking event (See FIG. 4). In one example, the cranking event includes starting the vehicle 10. The elapsed time of the minimum battery voltage (TVmin) represents the time period over which the minimum battery voltage of the vehicle battery 12 is measured.

The battery energy management circuit 19 includes a detector circuit 24, a pulse timer circuit 26 and a timer reset circuit 28. The microcontroller 16 includes an analog to digital (A/D) converter 20 and a pulse timer 22. The A/D converter 20 and the pulse timer 22 communicate with the battery energy management circuit 19 to detect and measure the minimum battery voltage (Vmin) of the vehicle battery 12. In one example, the A/D converter is configurable in both an output mode and an input mode (i.e., the A/D converter is operable both to communicate and receive signals).

The detector circuit 24 includes an op-amp 30, a diode 32 and a capacitor 34. These components operate in a known manner to store a voltage, for example. It should be understood that additional components may be included within the detector circuit 24 such as resistors, or additional capacitors, or any other component. One example detector circuit 24 also includes a resistor 35 which is operable to reduce the strength of a signal prior to communication of the signal to the op-amp 30.

The pulse timer circuit 26 includes a second op-amp 36, an AND gate 38 and a counter 40. The example timer reset circuit 28 includes at least one transistor 42 and a second capacitor 44. The timer reset circuit 28 includes two transistors. It should be understood that the pulse timer circuit 26 and the timer reset circuit 28 may include additional components.

The battery energy management system 18 measures the minimum battery voltage (Vmin) and the elapsed time of the minimum battery voltage (TVmin) as part of a vehicle diagnostic system of the vehicle 10. At any time prior to the starting of the vehicle 10 (i.e., during the cranking event), the A/D converter 20 (where configured in an output mode) communicates a supply voltage to the capacitor 34. The capacitor 34 stores the voltage associated with the supply voltage from the A/D converter for a period of time necessary for the microcontroller 16 to sample the voltage stored therein. The supply voltage is communicated from the A/D converter 20 to the capacitor 34 via electrical path 46. The supply voltage is 5 volts. The actual strength of the supply voltage will vary depending upon design specific parameters. After the capacitor 34 is charged, the A/D converter is configured back to the input mode in a known manner.

In addition, the pulse timer 22 communicates a clock signal to the AND gate 38 of the pulse timer circuit 26 prior to a cranking event. In one example, the clock signal comprises a pulse train of pulses (i.e., generated by a square wave of 50% duty cycle). In another example, the clock signal includes a free-running square wave having a known frequency. The clock signal is communicated from the pulse timer 22 to the AND gate 38 via electrical path 48. The clock signal is gated (i.e., started and stopped) by the AND gate 38. That is, the AND gate 38 receives the clock signal and awaits for an enable signal to be received via electrical path 70 from the pulse timer circuit 26 to enable the counter 40, as is further discussed below. It should be understood that the pulse timer 22 may communicate the clock signal at any time prior to a cranking event.

The vehicle battery 12 is directly connected to the battery energy management circuit 19. In response to a cranking event (i.e., starting of the vehicle 10), an input voltage signal is communicated from the vehicle battery 12 along electrical path 52 to the detector circuit 24. The input voltage signal is communicated to a positive input 54 of the op-amp 30. The op-amp 30 compares the input voltage signal at the positive input 54 with the voltage stored within capacitor 34, which is communicated to a negative input 56 of op-amp 30 via electrical path 58. The voltage stored within the capacitor 34 is discharged to the input voltage signal where the input voltage signal is less than the voltage stored within the capacitor 34. That is, the capacitor 34 is discharged to a voltage value that is relative to an existing minimum battery voltage (Vmin).

The diode 32 is operable to block voltage from communication along electrical path 60 where the voltage at the positive input 54 of the op-amp 30 is larger than the voltage at the negative input 56 of the op-amp 30. However, where the voltage at the positive input 54 is less than the voltage at the negative input 56, which would indicate the detection of a new minimum battery voltage (Vmin), the diode 32 allows a portion of the voltage stored in the capacitor 34 to be discharged. The capacitor 34 is discharged each time a new minimum battery voltage (Vmin) is detected by the op-amp 30 in response to a cranking event. That is, the diode 32 reduces the voltage stored within the capacitor 34 where the input voltage signal received at the positive input 54 of the op-amp 30 is a smaller voltage than the voltage stored within the capacitor 34.

Figure 4:
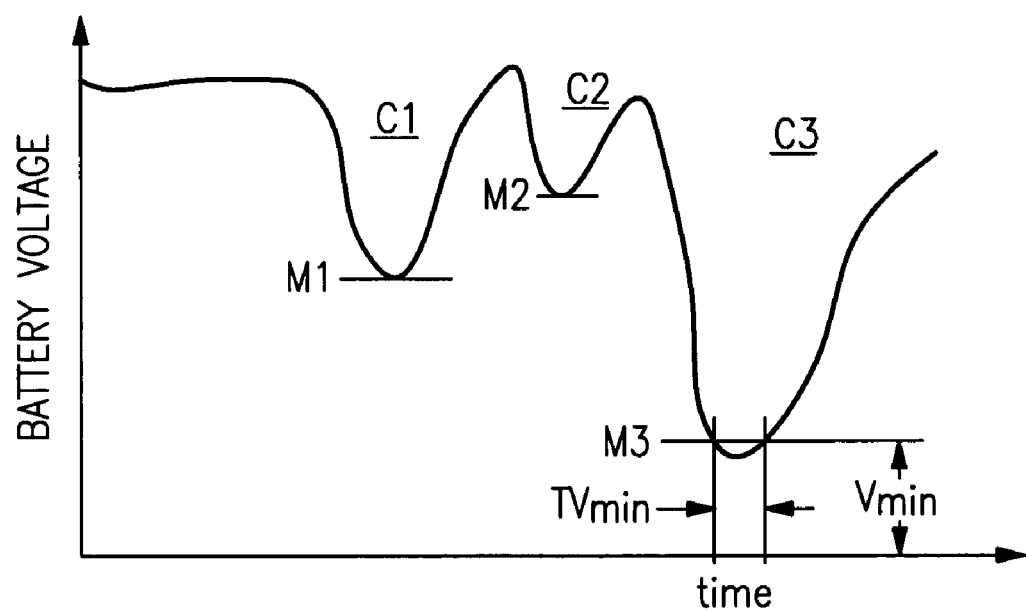
FIG. 4 is a graphical view of a minimum battery voltage measurement and an elapsed time of the minimum battery voltage measurement.

For example, as illustrated in FIG. 4, and with continuing reference to FIGS. 1 through 3, the vehicle battery 12 may experience minimum battery voltage values M1 through M3 during subsequent cranking events C1 through C3. In this example, the capacitor 34 is discharged to the minimum battery voltage values represented by M1 and M3, but not M2. This is because the input voltage signal that is generated by the C2 cranking event is not a minimum battery voltage as compared to the previous minimum battery voltage value stored in the capacitor 34 (i.e., M1). As can be appreciated, each time a new minimum battery voltage (Vmin) is detected during a cranking event, a new minimum battery voltage value is stored in the capacitor 34 of the detector circuit 24.

Simultaneously with the discharge of the capacitor 34 performed by the detector circuit 24, the pulse timer circuit 26 measures the approximate elapsed time of the minimum battery voltage (TVmin). The positive input 62 of op-amp 36 receives the voltage stored within the capacitor 34 via electrical path 64. The input voltage signal from the battery 12 is also communicated to a negative input 66 of the op-amp 36 via electrical path 68.

In one example, the op-amp 36 communicates an enable signal via electrical path 70 to the AND gate 38 in response to the detection of a new minimum battery voltage (Vmin). That is, the op-amp 36 communicates an electrical signal to the AND gate 38 where the voltage at the positive input 62 of the op-amp 36 is greater than the measured voltage at the negative input 66 of the op-amp 36. Once the AND gate 38 receives both the enable signal from electrical path 70 and the clock signal via electrical path 48 from the pulse timer 22, the AND gate 38 communicates a clock signal to the counter 40 via electrical path 72. In response, the counter 40 increments a count to measure the elapsed time of the minimum battery voltage (TVmin). The clock signal is no longer communicated via electrical path 72 to the counter in response to an increase in the minimum input voltage above the level of the voltage stored within the capacitor 34. The amount of time the counter 40 receives the clock signal via electrical path 72 is therefore equal to the amount of time a minimum battery voltage (Vmin) is detected by op-amp 36.

For example, assume the frequency of the clock signal communicated to the counter 40 via electrical path 72 is 100 Hz and that the counter 40 stores 50 counts during a cranking event. The elapsed time of the minimum battery voltage (TVmin) is therefore equal to 50 counts/100 Hz, or an elapsed time of 0.5 seconds.

Further in response to the detection of a minimum battery voltage (Vmin) at op-amps 30, 36 (i.e., where an input voltage signal is equal to a new minimum battery voltage), an electrical signal pulse generated by the output of the op-amp 36 and the capacitor 44 is communicated via electrical path 74 through the transistors 42. From the transistors 42, the electrical signal pulse is communicated via electrical path 76 to counter 40. In one example, the electrical signal received by the counter 40 via electrical path 76 resets the counter 40. That is, the counter 40 is reset to enable a new minimum battery voltage elapsed time (VTmin) to be measured in response to the detection of a new minimum input voltage (Vmin). However, the transistors 42 are operable to block the electrical signal from entering electrical path 76 where the input voltage signal received by op-amp 30 is greater than the voltage stored within the capacitor 34.

In one example, the A/D converter 20 measures the voltage stored within the capacitor 34 in response to a desired prompt. The desired prompt may include a command from the microcontroller 16. The predefined prompt includes a reduction in the load requirements of the microcontroller 16. That is, the A/D converter 20 measures the voltage stored within the capacitor 34 whenever the microcontroller 16 has completed other system requirements after completion of a cranking event. Advantageously, a minimum battery voltage (Vmin) and an elapsed time of the minimum battery voltage (TVmin) stored in counter 40 may be measured by the example battery energy management system 18 without a significant reduction in measurement accuracy and without undue delay that may result from an overloaded microcontroller 16.

Figure 5:
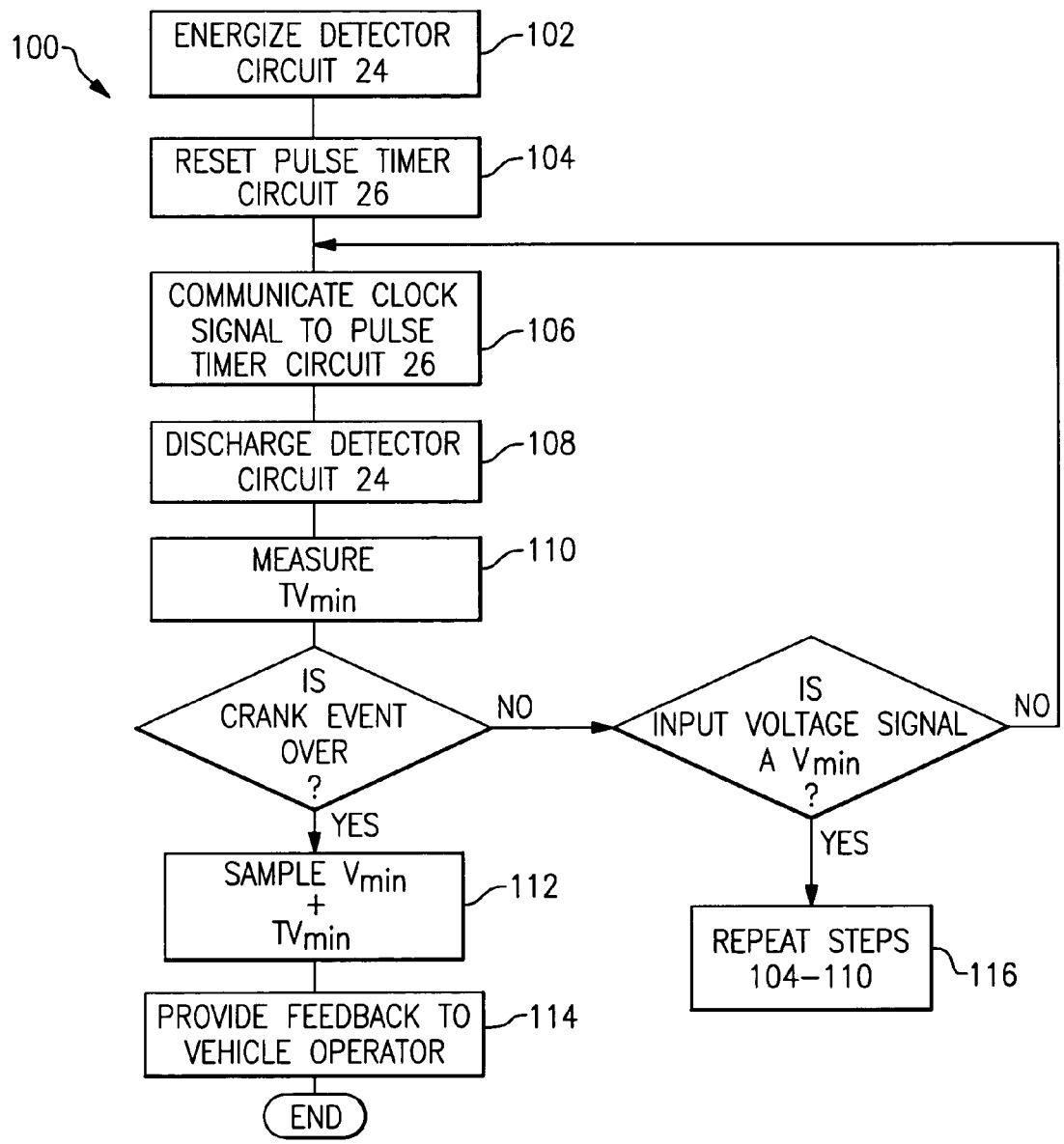
FIG. 5 is a functional block diagram illustrating an example method of measuring the minimum battery voltage of a battery during a cranking event.

Referring to FIG. 5, and with continuing reference to FIGS. 1-4, a method 100 for monitoring a battery energy management system is illustrated. The method begins at step block 102 where the microcontroller 16 energizes the detector circuit 24 with a supply voltage. The detector circuit 24 stores the voltage until a minimum battery voltage (Vmin) is detected. At step block 104, the pulse timer circuit 26 is reset. A clock signal is communicated to the pulse timer circuit 26 from the microcontroller 16 at step block 106. In one example, step block 102 is performed prior to a cranking event.

Next, at step block 108, the detector circuit 24 is discharged to a voltage value that is relative to an existing minimum battery voltage. In one example, the input voltage signal is communicated from the battery 12 to the detector circuit 24 in response to a cranking event. The elapsed time of the minimum battery voltage (TVmin) is measured at step block 110. In one example, each of step blocks 104, 106, 108 and 110 are executed in response an input voltage signal from the battery 12 being less than the voltage stored within the detector circuit 24

The minimum battery voltage (Vmin) and the elapsed time of the minimum battery voltage (TVmin) are sampled by the microcontroller 16 during the cranking event at step block 112 and feedback is provided to a vehicle operator at step block 114. In one example, the minimum battery voltage (Vmin) and elapsed time measurement (TVmin) are sampled in response to a reduction in the loading requirements of the microcontroller after completion of a cranking event. In one example, feedback is provided to the operator by illuminating a symbol located on the vehicle instrument panel where the minimum battery voltage (Vmin) and the elapsed time of the minimum battery voltage (TVmin) are below a certain threshold. If the cranking event is still occurring, the method proceeds to step block 116 where step blocks 104 through 110 are repeated where the input voltage signal from the battery 12 correlates to a new minimum battery voltage (Vmin).

The foregoing description shall be interpreted as illustrative and not in any limiting sense. A worker of ordinary skill in the art would recognize that certain modifications would come within the scope of this invention. For that reason, the follow claims should be studied to determine the true scope and content of this invention.

What is claimed is:

1. A method of measuring a minimum battery voltage, comprising the steps of:
    (a) storing a voltage in a detector circuit that is external to a microcontroller;
    (b) modifying the voltage in response to receiving an input voltage signal; and
    (c) sampling the voltage in response to receiving a command from the microcontroller.

2. The method as recited in claim 1, wherein the voltage comprises a supply voltage and said step (a) comprises:
    charging a detector circuit with the supply voltage.

3. The method as recited in claim 2, further comprising the steps of:
    (d) discharging the detector circuit to a minimum battery voltage;
    (e) measuring an elapsed time that the minimum battery voltage is detected;
    (f) resetting a timer circuit; and
    (g) sampling the minimum battery voltage and the elapsed time of the minimum battery voltage.

4. The method as recited in claim 3, wherein said step (d), said step (e) and said step (f) are each performed in response to the input voltage signal being less than the voltage stored within the detector circuit.

5. The method as recited in claim 3, further comprising the step of:
    (h) repeating said steps (d) through (g) each time the input voltage signal is less than the minimum battery voltage stored within the detector circuit.

6. The method as recited in claim 3, wherein the input voltage signal is communicated to the detector circuit in response to a cranking event.

7. The method as recited in claim 3, wherein said steps (d) through (f) are performed subsequent to the step of:
    (h) communicating a clock signal to the timer circuit.

8. The method as recited in claim 3, wherein said step (f) is performed prior to said step (e).

9. The method as recited in claim 1, wherein said step (b) is performed only in response to the input voltage signal being less than the stored voltage.

10. A battery energy management system, comprising:
    a microcontroller; and
    a battery energy management circuit that stores a voltage, wherein said battery energy management circuit is at least partially mounted separate from said microcontroller, and said battery energy management circuit is operable to modify said voltage and sample a minimum battery voltage in response to a command from said microcontroller.

11. The system as recited in claim 10, wherein said battery energy management circuit comprises a detector circuit that stores a minimum battery voltage, a timer circuit that measures an elapsed time of said minimum battery voltage, and a timer reset circuit that resets said timer circuit, wherein said detector circuit stores said minimum battery voltage, said timer circuit measures said elapsed time of said minimum battery voltage and said timer reset circuit resets said timer circuit in response to detection of said minimum battery voltage.

12. The system as recited in claim 11, wherein the detection of said minimum battery voltage occurs in response to an input voltage signal communicated from a vehicle battery being less than said voltage stored within said battery energy management circuit.

13. The system as recited in claim 11, wherein said detector circuit comprises at least one op-amp, at least one diode and at least one capacitor.

14. The system as recited in claim 13, wherein said minimum battery voltage is stored within said at least one capacitor.

15. The system as recited in claim 11, wherein said timer circuit comprises an op-amp, an AND gate and a counter.

16. The system as recited in claim 11, wherein said timer reset circuit comprises at least one transistor and at least one capacitor.

17. The system as recited in claim 10, wherein said microcontroller comprises an A/D converter and a pulse timer, wherein said A/D converter communicates a supply voltage to said detector circuit and said pulse timer communicates a clock signal to said timer circuit prior to engine cranking.

18. The system as recited in claim 10, wherein said battery energy management circuit is operable to sample a minimum battery voltage and an elapsed time of said minimum battery voltage in response to a command from said microcontroller.

* * * * *